United States Patent [19]

Hagen et al.

[11] Patent Number: 4,970,419

[45] Date of Patent: Nov. 13, 1990

[54] LOW-NOISE TRANSMISSION LINE TERMINATION CIRCUITRY

[75] Inventors: Timothy P. Hagen, Ramona, Calif.; Paul G. Tumms, Fridley, Minn.

[73] Assignee: Unisys Corp., Detroit, Mich.

[21] Appl. No.: 28,984

[22] Filed: Mar. 23, 1987

[51] Int. Cl.[5] .......................... H03B 1/04; H03K 5/00
[52] U.S. Cl. ................................ 307/542; 307/549; 307/443; 307/264
[58] Field of Search .............. 307/542, 551, 559, 565, 307/567, 443, 264

[56] References Cited

U.S. PATENT DOCUMENTS

| | | | |
|---|---|---|---|
| 2,863,123 | 12/1958 | Koch | 307/567 |
| 2,873,387 | 2/1959 | Kidd | 307/567 |
| 3,126,488 | 3/1964 | Johnson | 307/542 |
| 3,555,299 | 1/1972 | Millward | 307/565 |
| 3,735,152 | 5/1973 | Oda | 307/549 |
| 3,760,196 | 9/1973 | Nomoto et al. | 307/549 |
| 3,798,559 | 3/1974 | Tomita et al. | 307/549 |
| 3,816,762 | 6/1974 | Holt, Jr. | 307/549 |
| 3,832,575 | 8/1974 | Dasgupta et al. | 307/443 |
| 3,937,988 | 2/1976 | DeClue et al. | 307/549 |
| 4,398,106 | 8/1983 | Davidson et al. | 307/549 |
| 4,508,981 | 4/1985 | Dorler et al. | 307/542 |
| 4,709,171 | 11/1987 | Main | 307/567 |

Primary Examiner—Stanley D. Miller
Assistant Examiner—Timothy P. Callahan
Attorney, Agent, or Firm—Nathan Cass; Robert S. Bramson; Mark T. Starr

[57] ABSTRACT

Transmission line termination circuitry is provided on a driven IC chip utilizing active transistors constructed and arranged so as to steer appropriately directed damping currents into the input bus in a manner which effectively minimizes both overshoot and undershoot without making undue demands on the normally provided chip power supply.

4 Claims, 3 Drawing Sheets

LOW-NOISE TRANSMISSION LINE TERMINATION CIRCUITRY

BACKGROUND OF THE INVENTION

This invention generally relates to improved means and methods for implementing computer data processing operations, and more particularly to improved means and methods for terminating printed circuit boards or multiple integrated circuit (IC) chip networks.

As is well known, problems arise when interconnecting IC chips because of noise (such as caused by reflections, transient signals and ringing) occurring as a result of transmission line termination effects. The presence of such noise can have a significant effect on the performance and reliability of IC chip circuitry.

Known approaches for solving the above problems typically involve the provision of special transmission line terminating circuitry which is attached to those transmission line terminations which exhibit unacceptable noise. Besides adding to manufacturing expenses because of the added materials and production costs of these attachments, they have not always been effective. Furthermore, in order to work properly, they may impact IC chip design, such as, for example, by requiring a larger and better regulated IC chip power supply, and/or requiring the IC chips to support larger switching currents. Still further, as IC chip operating speeds increase, the effectiveness of such line termination circuitry is expected to be even more limited.

OBJECTS AND SUMMARY OF THE INVENTION

It is accordingly a broad object of the present invention to provide improved means and methods for terminating transmission lines in a computer system.

A more specific object of the invention is to provide on-chip transmission line termination circuitry for a driven IC chip which significantly reduces transients and ringing, even at high operating speeds.

In a preferred embodiment of the invention transmission line termination circuitry is provided on a driven IC chip. This on-chip transmission line circuitry utilizes active transistors constructed and arranged so as to steer appropriately directed damping currents into the input bus in a manner which effectively minimizes both overshoot and undershoot without making undue demands on the normally provided chip power supply.

The specific nature of the invention as well as other objects, features, advantages and/or uses will become evident from the following description of a preferred embodiment in conjunction with the accompanying drawings.

DESCRIPTION OF A PREFERRED EMBODIMENT

Like characters and numerals refer to like elements throughout the drawings.

Figure 1:
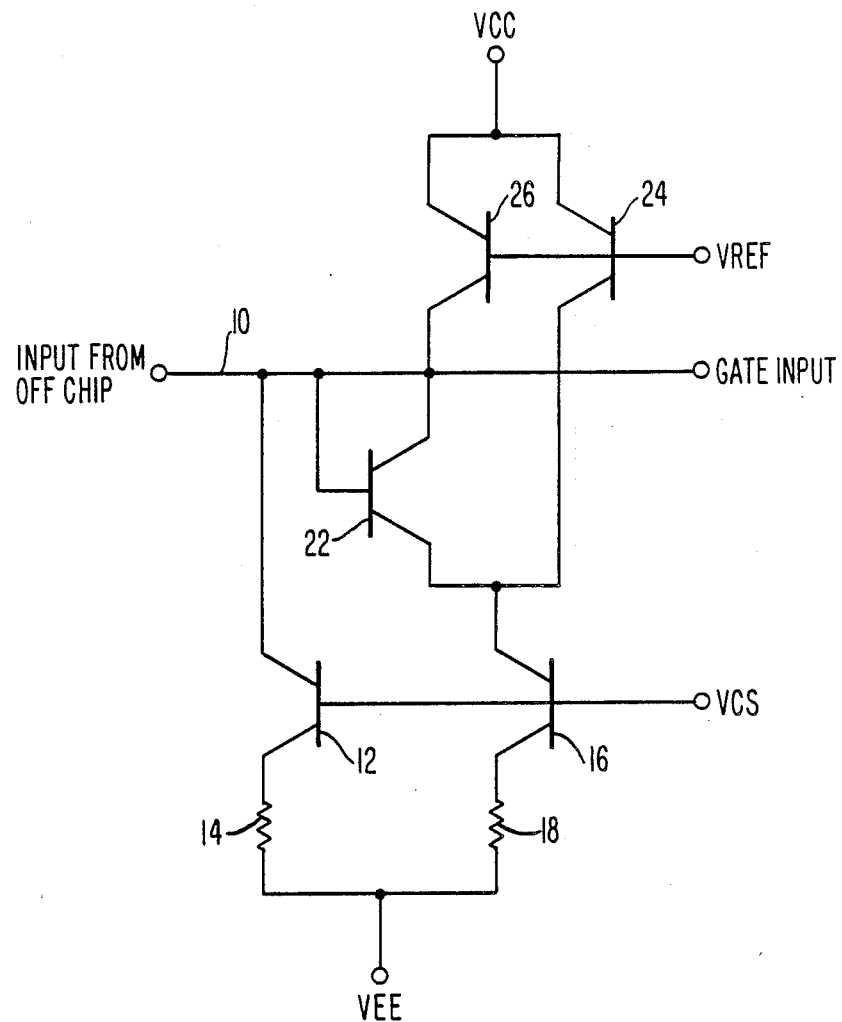
FIG. 1 is an electrical circuit diagram of a preferred embodiment of an on-chip transmission line termination circuit in accordance with the invention.

With reference to the preferred on-chip transmission line termination circuitry shown in FIG. 1, it will be understood that this termination circuit is typically formed on an IC chip when the other chip circuitry is formed. Since only the termination circuitry provided on the chip is pertinent to the present invention, other chip circuitry is not shown in FIG. 1, except for the chip input line 10 (which, for example, receives logical signals transmitted thereto from another IC chip), and voltages VEE, VCS and VCC (which may be derived from the normally provided chip power sources).

It will be understood from FIG. 1 that transistor 12 and resistor 14 are coupled between VEE and the chip input line 10 so as to form a first constant current source which is used to provide a DC load to the logical signal source circuit from which an input logical signal is transmitted. In the particular circuit shown in FIG. 1, the collector of transistor 12 is connected to the input line 10, the base of transistor 12 is connected to the supply voltage VCS, the emitter of transistor 12 is connected to the upper end of resistor 14, and the lower end of resistor 14 is connected to the supply voltage VEE.

Transistor 16 and resistor 18 in FIG. 1 are constructed and arranged so as to form a second constant current source which is used in conjunction with a current steering switch formed by transistors 22 and 24 to set the clamp current for the low-to-high transition of the input logical signal. In the particular circuit shown in FIG. 1, the lower end of resistor 18 is connected to the voltage VEE, the upper end of resistor 18 is connected to the emitter of transistor 16, the base of transistor 16 is connected to the voltage VCS, the collector of transistor 16 is connected to the emitters of transistors 22 and 24, the base and collector of transistor 22 are connected to the input line 10, the base of transistor 24 is connected to the reference voltage VREF, and the collector of transistor 22 is connected to the voltage VCC, which is typically circuit ground.

A transistor 26 having its collector connected to the voltage VCC, its base connected to the voltage VREF and its emitter connected to the input line 10 is used to clamp the falling edge of an applied logical signal, as well as to provide short circuit protection for the clamp circuit. In the circuit of FIG. 1, VREF and VCS serve as the signal reference and current source reference voltages, respectively, and VEE serves as the current source voltage.

Operation of the circuit of FIG. 1 is such that, when the input logical level on the input line 10 is low, current flows through transistor 24. When a high logical level signal is received at the input line 10, the current continues to flow through transistor 24 until the input signal level rises above VREF. The current is then supplied by the input line 10 and flows through transistor 22. Thus, the input line 10 sees a step increase in load current as its voltage rises to the high logical level, which thereby results in reducing the resulting overshoot. Any undershoot occurring following the overshoot is reduced by transistor 26 being turned on to clamp the input line if the voltage on the input line 10 drops lower than a diode drop from VREF.

Figure 2:
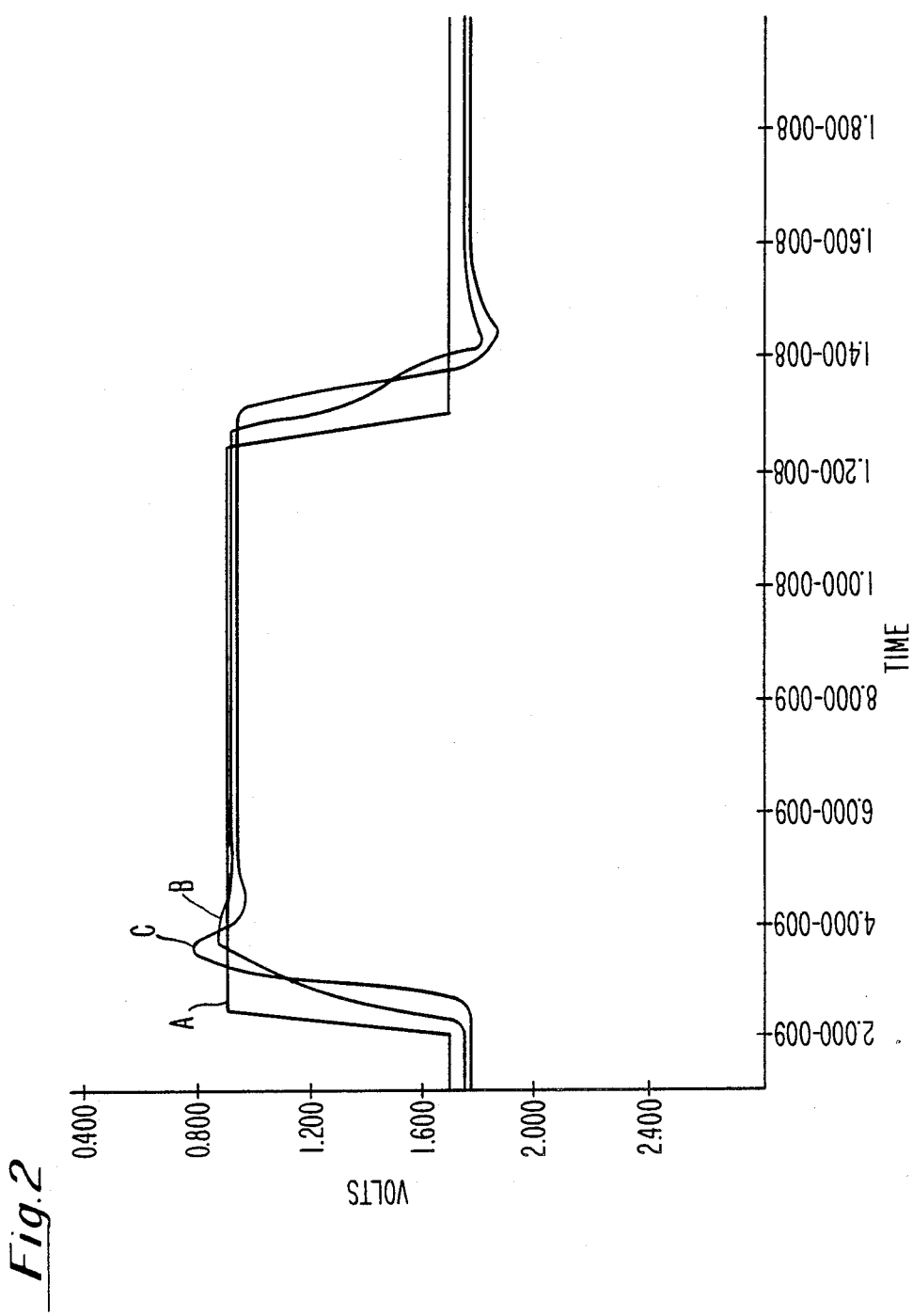
FIG. 2 is a graph illustrating typical performance of the circuit of FIG. 1.
Figure 3:
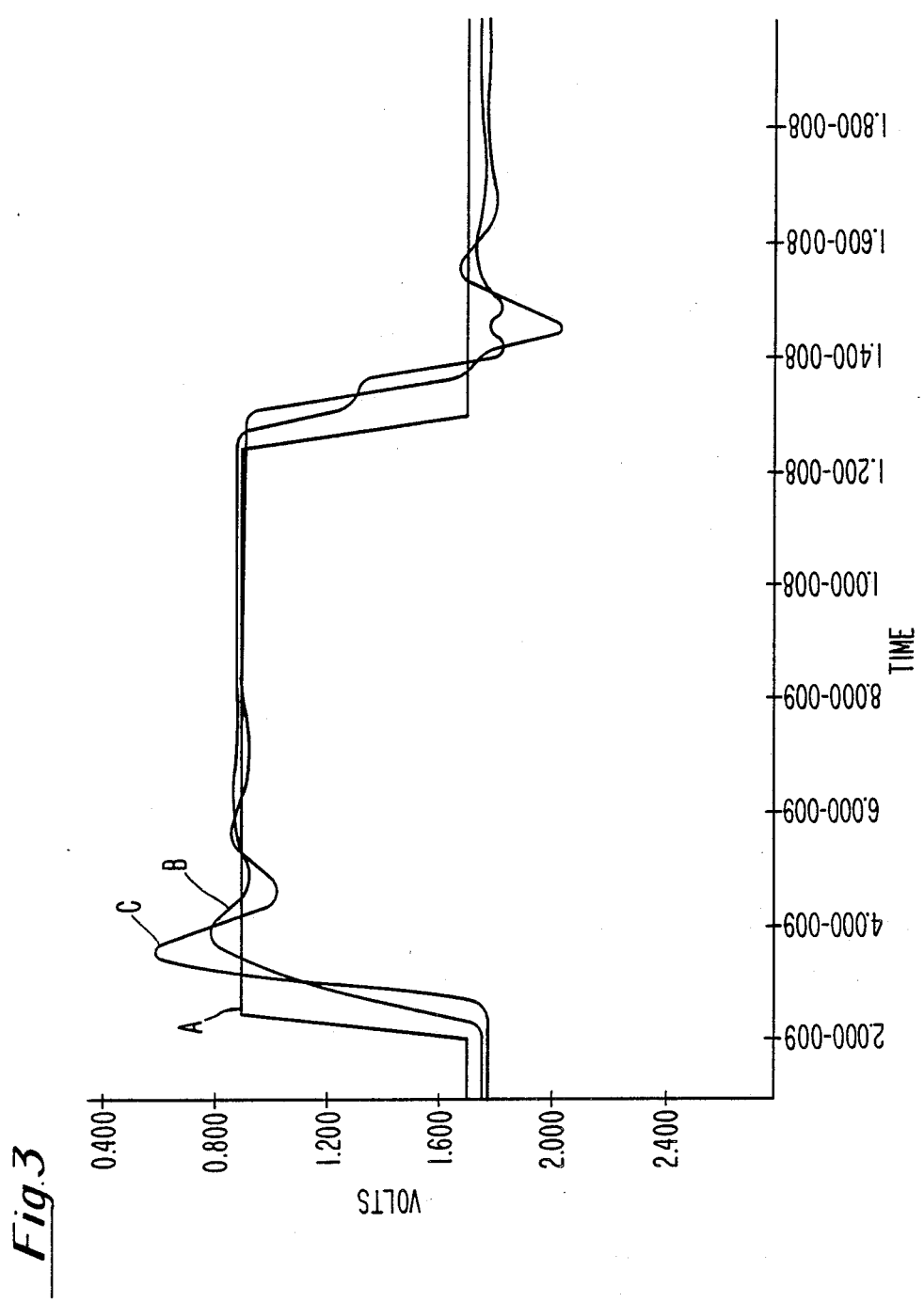
FIG. 3 is a graph illustrating performance when the circuit of FIG. 1 is absent.

FIGS. 2 and 3 are voltage vs. time graphs. FIG. 2 illustrates typical performance of the line termination circuit shown in FIG. 1 for a transmission line length of 5 cm. FIG. 3 illustrates performance when the circuit of FIG. 1 is absent. Curve A corresponds to the driver signal at the end of the transmission line, curve B corresponds to the resulting signal obtained on the input line 10 (that is, the termination end of the transmission line), and curve C illustrates the load signal. It will be evident from FIGS. 2 and 3 that a change from a high logical level to a low logical level produces a similar effect as a change from a low logical level to a high logical level.

The following components and values may typically be employed in the circuit of FIG. 1:

| Resistor 14 | 44 ohms |
| Resistor 18 | 130 ohms |
| Transistors 12 and 16 | NPN transistor (4 × 16 μM emitter) |
| Transistors 22, 24 and 26 | NPN transistor (3 × 16 μM emitter) |
| VEE | 4.5 volts |
| VREF | 1.0 volts |
| VCC | 0 volts (circuit ground) |

The circuit of FIG. 1 provides a number of significant advantages. One important advantage is that VREF does not have to support large switching currents. The only switching current drawn by the circuit of FIG. 1 comes from VCC (typically circuit ground) which is already well distributed. Thus, the IC chip in which the circuit of FIG. 1 is provided does not require large bus structures or high power on-chip voltage generators. Another advantage of the circuit of FIG. 1 is that the signal line 10 is well isolated from the power supply busses.

An additional advantage of the circuit of FIG. 1 is that the value of VEE is not critical. For example, using the specific components and values for the circuit of FIG. 1 set forth above, the circuit of FIG. 1 can operate off of any VEE voltage greater than 3.0 volts without changes in the circuitry.

Although the present invention has been described with reference to a particular preferred embodiment, it is to be understood that various modifications in construction, arrangement and use are possible without departing from the true scope and spirit of the present invention. Accordingly, the present invention is to be considered as encompassing all possible modifications and variations coming within the scope of the appended claims.

What is claimed is:

1. For use in a computer circuit, the combination comprising:
    an integrated circuit chip having an input for receiving a binary input signal; and
    transmission line termination circuitry included on said integrated circuit chip and coupled to said input for reducing noise occurring when a binary signal is transmitted to said input;
    said transmission line termination circuitry comprising a first constant current source, a second constant current source, and a switchable current steering switch, said first current source being coupled to said input so as to provide a DC load at said input for an applied signal, and said second current source being coupled to said input via said switchable current steering switch for setting clamping current for a transition of said binary signal;
    said first current source including a first transistor coupled between a current supply voltage and said input, said second current source including a second transistor coupled between said current supply voltage and said current switch, and each of said first and second transistors including a control terminal coupled to a control voltage source;
    said switchable current steering switch being operative to switch in response to said binary input signal rising to a predetermined level so as to cause the input signal to see a step increase in load current as it increases above said predetermined level.

2. The invention in accordance with claim 1, wherein said switchable current steering switch includes a third transistor coupled between said second transistor and a switching voltage and a fourth transistor coupled between said second current supply voltage and said input, and wherein said third transistor and said fourth transistor each include a control terminal coupled to a reference voltage chosen based on the levels of said binary signal.

3. The invention in accordance with claim 2, wherein said switching voltage is circuit ground.

4. The invention i accordance with claim 2, wherein said circuit means additionally includes a fifth transistor coupled between said switching voltage and said input for providing falling edge clamping, said fifth transistor including a control terminal coupled to said reference voltage.

* * * * *